United States Patent
Kohmoto et al.

(10) Patent No.: US 6,806,547 B2
(45) Date of Patent: Oct. 19, 2004

(54) LIGHT-RECEIVING MODULE

(75) Inventors: Kenichiro Kohmoto, Kanagawa (JP); Takeshi Sekiguchi, Kanagawa (JP); Makoto Ito, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/397,839

(22) Filed: Mar. 27, 2003

(65) Prior Publication Data

US 2003/0183834 A1 Oct. 2, 2003

Related U.S. Application Data

(63) Continuation-in-part of application No. 10/373,186, filed on Feb. 26, 2003.

(30) Foreign Application Priority Data

Mar. 28, 2002 (JP) ......................................... 2002-092303

(51) Int. Cl.[7] ..................... H01L 31/0203; H01L 31/00; H01L 29/00

(52) U.S. Cl. ....................... 257/433; 257/459; 257/532

(58) Field of Search ................................ 257/459, 433, 257/434, 532

(56) References Cited

U.S. PATENT DOCUMENTS 5,841,565 A * 11/1998 Kanai .......................... 398/202
6,034,424 A * 3/2000 Fujimura et al. ............ 257/696

* cited by examiner

Primary Examiner—Ngân V. Ngô
(74) Attorney, Agent, or Firm—McDermott Will & Emery LLP

(57) ABSTRACT

An optical module comprises a photodiode, an amplifying device, and a die capacitor. The die capacitor has at least a center pad, the photodiode is mounted thereon, and other pads on both side of the center pad. The die capacitor is mounted on a mounting surface of the module so as to locate the photodiode to be center of the surface. The amplifying device has a signal pad and a plural ground pad surrounding the signal pad. The signal pad is connected to the photodiode, while the ground pads are connected to the mounting surface through other pads on both side of the die capacitor.

3 Claims, 7 Drawing Sheets

LIGHT-RECEIVING MODULE

CROSS REFERENCES TO RELATED APPLICATIONS

This is a Continuation-In-Part application of pending U.S. patent application Ser. No. 10/373,186, entitled "A light-receiving Module", filed Feb. 26, 2003; priority is claimed from this application and is incorporated herein by reference.

BACKGROUND OF THE INVENTION

1. Field of the Invention

This invention relates to a light-receiving module, in which an optical signal is converted to an electrical signal.

2. Related Prior Art

FIG. 7 is a plan view of a conventional light-receiving module. As shown in FIG. 7, the conventional module 101 has a semiconductor light-receiving device 131, such as a photodiode, a base 111 for mounting the light-receiving device 131, a plurality of lead terminals 121 to 124, and a semiconductor electronic device 151.

The base 111 is made of a conductive material and has a mounting surface 112. The electrical isolation between the lead terminals and the base 111 are performed by an insulating glass material, which fixes and seals the lead terminals 121 to 124 to the base 111.

The semiconductor light-receiving device 131 has a light-sensing area 132 on top of the device and has a first, a second, and a third electrode. The first electrode 133 is wire-bonded to the lead terminal 121. The third electrode 135 outputs a current signal corresponding to the inputted optical signal to the electronic device 151. Also, a resistor element 136 is integrated in the light-receiving device, which connects the first electrode 131 to the second electrode 132.

The die capacitor 141, a shape of which is a board-like, has one pad on a surface facing to the base 111 and two pads 142, 143 on the other surface. The light-receiving device 131 is mounted on one of two pads 142. The second electrode 134 of the light-receiving device 131 is wire-bonded to the pads 142 mounted the light-receiving device thereon. The other pad of the die capacitor is wire-bonded to the lead terminal 122. The resistor element 136 in the light-receiving device 131 combined with the die capacitor 141 functions as a CR-filter, that is, it operates a de-coupling filter of a bias applied to the light-receiving device.

The semiconductor electronic device 51 converts the current signal from the light-receiving device 131 into a voltage signal and amplifies the voltage signal. The electronic device 151 has a plural electrode and a ground electrode wire-bonded directly to the base 111. A first electrode 152 is wire-bonded to the pad 143 of the die capacitor 141 for supplying a bias voltage Vdd to the electronic device 151. A second electrode 153 is connected to the third electrode of the light-receiving device 131 for inputting the current signal therefrom. A third electrode 154 and a fourth electrode 155 are wire-bonded to lead terminals 123 and 124, respectively, for outputting amplified signals that are complementary to each other. A fifth electrode 156 is wire-bonded to a second die capacitor 161 mounted on the base 111. A pad of a third die capacitor 162 is also connected to the lead terminal 122.

The current optical communication using an optical module shown in FIG. 7 requires a transmission speed over 2.5 Gbps. In such high-speed application, the conventional optical module can not be applicable because a bonding wire, for example connecting the light-receiving device to the electronic device, behaves as an inductance. When the electrical signal transmits such bonding wires, a loss of the signal and reflection at points where the bonding wires are connected may occur. The higher the transmission speeds, the more serious the parasitic inductance problem. Moreover, a signal leak through a bias line influences an operation of the semiconductor electronic device. Occasionally, the instability of the signal leak causes a self-oscillation of the electronic device.

One solution for the above-mentioned problem is to lower the transmission impedance of the signal line and also the bias supply line. It is effective for lowering the transmission impedance to connect devices by plural wires or to surround the signal line by lines with low impedance such as a ground line.

However, a request for a small-sized and a lightweight module is growing more and more in the optical communication. Additional electronic parts for realizing the low impedance line are difficult to be installed in such small-sized optical module. Also, it is difficult to surround the signal line by plural lines with low impedance because only a restricted space for wiring is allowed in such module.

SUMMARY OF THE INVENTION

An object of the present invention is to provide an optical module that realizes a low impedance signal line with a simple configuration.

According to a present invention, a light-receiving module comprises a base made of a conducting material, a semiconductor light-receiving device, a semiconductor electronic device and a die capacitor. The light-receiving device has a light-sensing portion and a signal-outputting electrode for outputting current signal corresponding to an optical signal entered into the light-sensing portion. The electronic device has a signal-inputting electrode and two ground electrodes located both sides of the signal-inputting electrode. The die capacitor has a primary pad and at least two auxiliary pads. The primary pad and two auxiliary pads are arranged in parallel so as to insert the primary pad therebetween. The light-receiving device is mounted on the primary pad and the outputting electrode is wire-bonded to the signal-inputting electrode of the electronic device. The electronic device is mounted on the base adjacent to the-die capacitor so as to face the signal-inputting electrode thereof to the signal-outputting electrode of the light-receiving device. The ground electrodes located both sides of the signal-inputting electrode are connected to the respective auxiliary pads of the die capacitor, and the respective auxiliary pads are wire-bonded to the base.

In the present module, the ground electrodes located both sides of the signal-inputting electrode of the electronic device are grounded to the base through the respective auxiliary pads of the die capacitor. This enable to shorten a total length of bonding wire form the ground electrode to the pad of the die capacitor and from the pad to the base as compared with the case that the ground electrode is directly connected to the base. Therefore, it is able to avoid the influence of the parasitic inductance of the bonding wire and to protect from the deformation of the bonding wire so that the bonding wire is hard to touch an undesirable portion. The present module realizes a configuration that the signal line from the light-receiving device to the electronic device is surrounded by plural ground line, which results in lowering the impedance of the signal line.

Moreover, the die capacitor preferably includes additional pad in the outer side of the auxiliary pad relative to the primary pad. The additional pad is preferably connected to a bias electrode of the electronic device. The die capacitor thus connected to the bias electrode operates as a de-coupling capacitor, which lower the impedance of the bias line.

Further aspect of the present invention, the electronic device preferably has a pair of outputting-electrode. The signals complementary to each other are output from outputting-electrodes to the respective lead terminals. The outputting electrodes faces the respective electrodes so as to shorten the bonding wire therebetween, thus suppressing the influence of the parasitic inductance of the bonding wire.

DETAILED DESCRIPTION OF THE INVENTION

Figure 1:
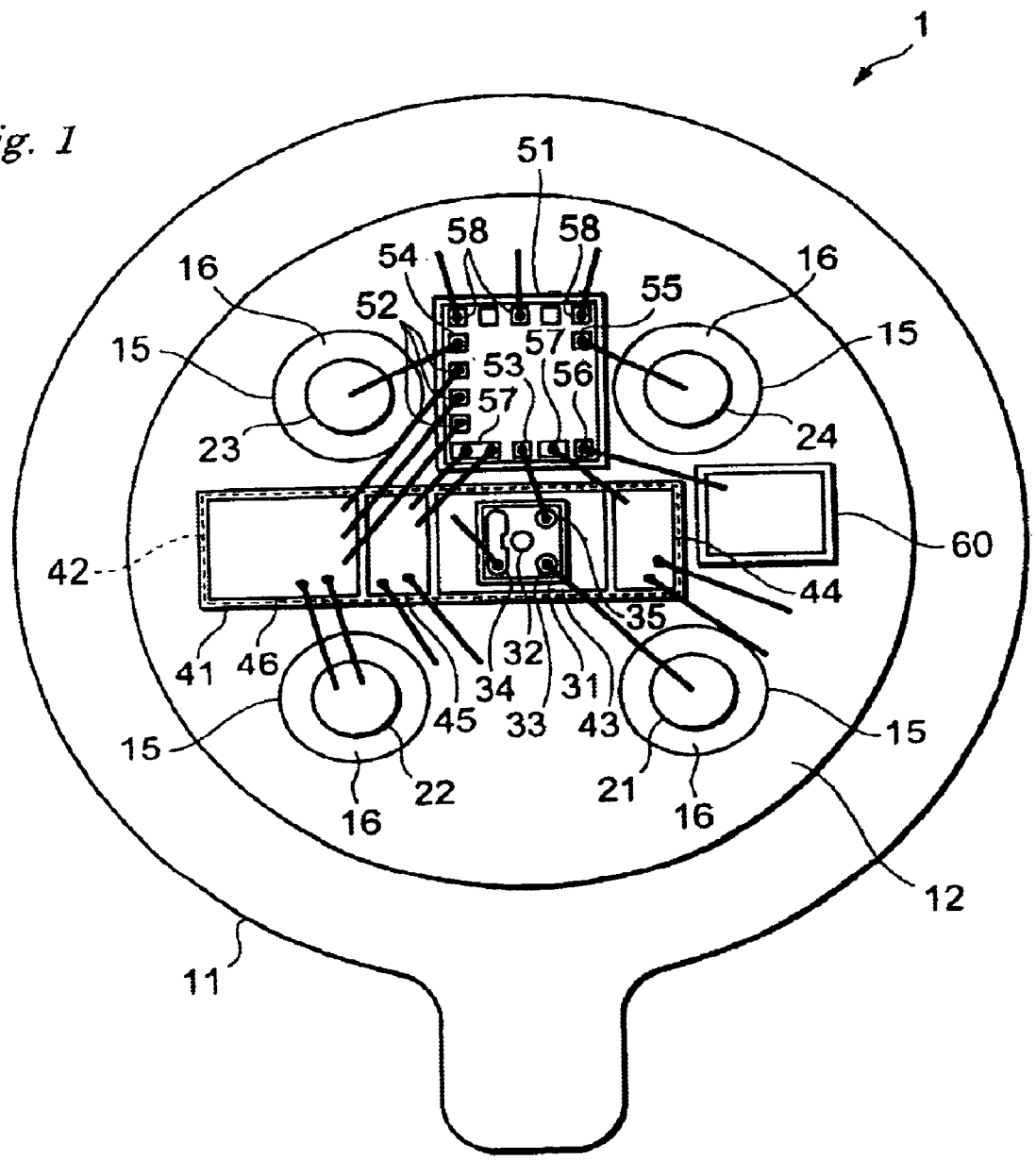
FIG. 1 is a plan view showing the first embodiment of the present optical module.

The preferred embodiments of the present invention will be described. Elements identical to each other will be referred to with numerals identical to each other without overlapping explanations. In the drawings, dimensions such as the thickness and the diameter of the lead terminals will not always reflect their explanation.

First Embodiment

Figure 2:
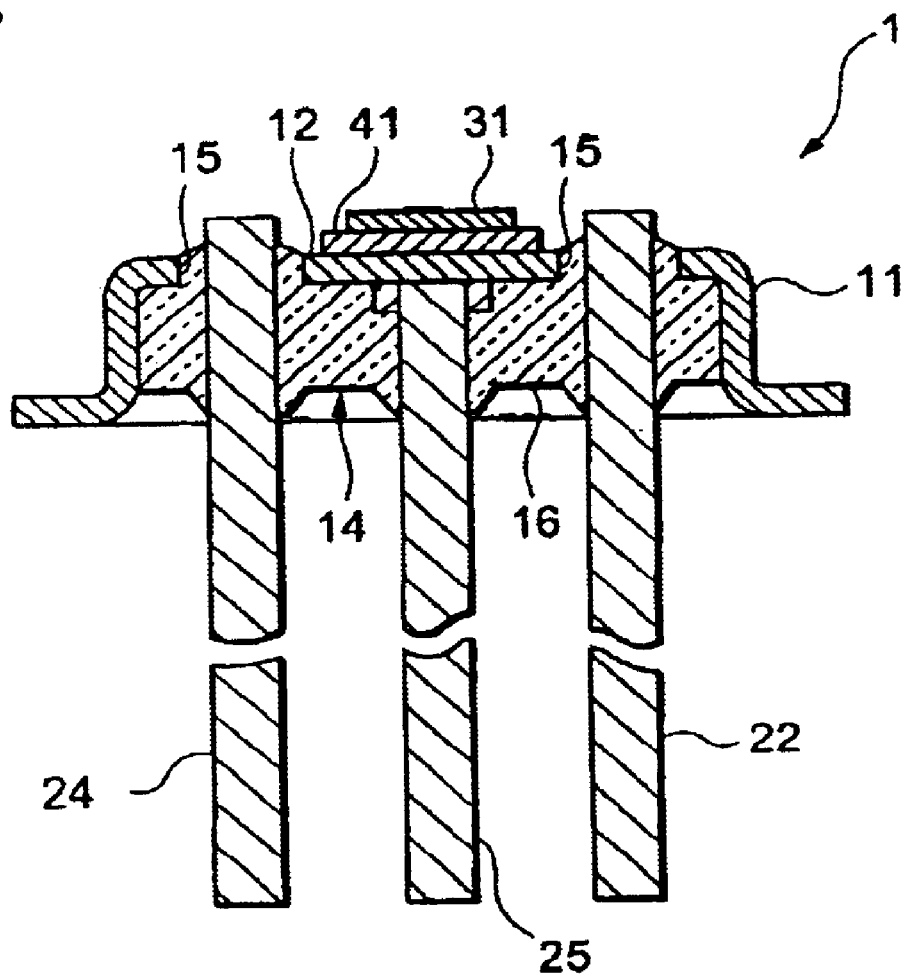
FIG. 2 is a cross sectional view of the first embodiment.
Figure 3:
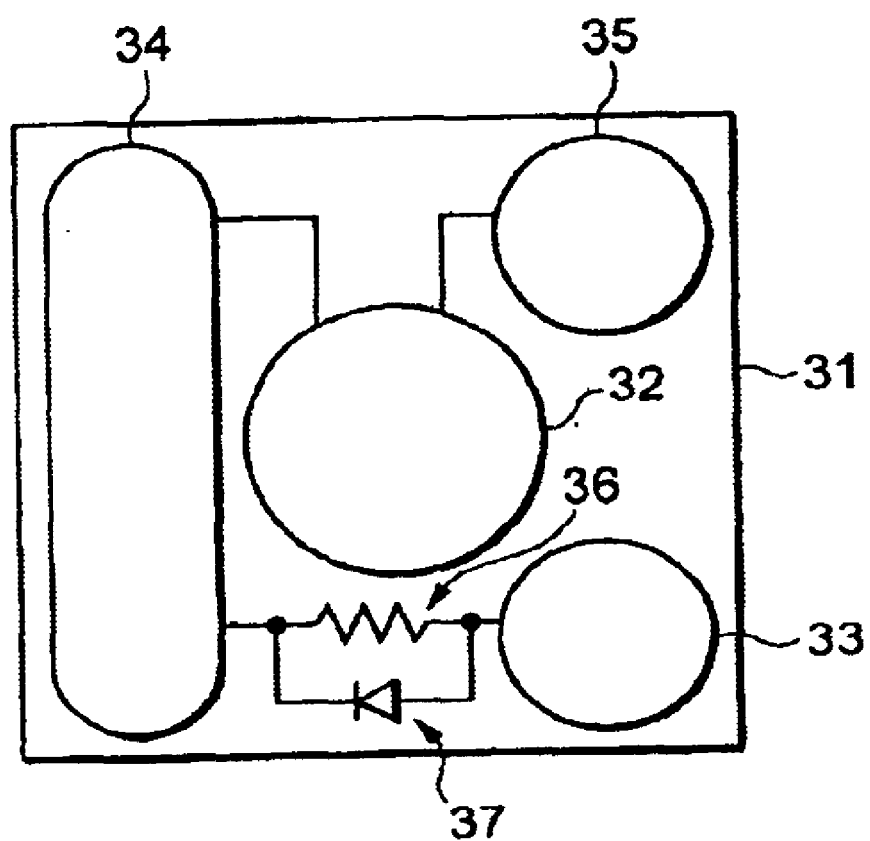
FIG. 3 shows a configuration of the light-receiving device containing the light-receiving module.

FIG. 1 is a plan view and FIG. 2 is a cross-sectional view of an optical module according to the first embodiment of the present invention. The optical module shown in figures is used as a receiving optical sub-assembly (ROSA) of an optical transceiver. The module has a base 11, a semiconductor light-receiving device 31, a die capacitor 41, a semiconductor electronic device 51, and a plurality of lead terminals 21 to 25.

The base 11 comprises of a mounting surface 12 where the die capacitor 41 and the electronic device 51 are mounted thereon. The semiconductor light-receiving device 21 is stacked on the die capacitor 41. The base 11 has a diameter of about 4.2 mm and made of metal such as Kovar or CuW, entire surface of which is plated with gold.

The base 11 has a plurality of holes 15 into which respective lead terminals 21 to 34 are inserted. The tips of the terminals protrude from the mount surface 12 by a length, for example about 0.35 mm, and fixed to the base 11 as electrically isolated therefrom. A glass sealant filled up spaces between the lead terminals and the base 11 performs the isolation of the lead terminals.

The lead terminal 21 supplies a bias voltage Vpd to the light-receiving device 31, while the lead terminal 22 supplies another bias voltage Vcc to the semiconductor electronic device 51. The lead terminals 23 and 24 output signals amplified by the semiconductor device 51 to the outside of the module. The last lead terminal 25 is connected to the outer surface of the base 11. These lead terminals are made of Kovar and the diameter is set to be 0.45 mm.

The die capacitor 41 has a pad 42 on a surface facing and contacting to the base 11 and at least three pads 43 to 45 on the other surface. The die capacitor is placed so that the center pad 44 locates at the center of the mounting surface 12. The size of the die capacitor 41 is 0.7 mm of width, 2.6 mm of length and 0.2 mm of thickness, that of the center pad 43 is 0.6 mm of width and 0.9 mm of length, and that of other pads 44 and 45 are 0.6 mm of width and 0.8 mm of length.

The pads 44 and 45, which locate at both sides of the center pad 43, are electrically grounded to the base 11 by a plural wire. Another pad 46 locating at the outermost of the primary surface of the die capacitor 41 is connected to the lead terminal 22 by a plural wire.

FIG. 2 is a plan view of the light-sensing device 31. The light-receiving device 31 is preferably a photodiode, which has a light-sensing area 32, a first electrode 33, a second electrode 34, and a third electrode 35. Further, a resistor element 36 and another diode 37 connected in parallel to the resistor 36 are integrated between the first electrode 33 and the second electrode 34. A chip size of the light-receiving device 31 is 0.5 mm square and a thickness of 0.2 mm. This light-receiving device is mounted on the center pad 43 of the die capacitor 41 namely, the die capacitor is mounted so as to locate the light-sensing portion 32 of the light-receiving device to the center of the mount surface 12.

The first electrode 33 is formed at one corner of the light-receiving device 31 and is wire-bonded to the lead terminal 21 for supplying a bias voltage Vpd to the light-receiving device 21. The third electrode 35, which is formed at another corner of the device 31, is provided for outputting a current signal obtained by converting an incident light. The second electrode 34, which is formed along one side of the device 31, is electrically connected to the pad 43 of the die capacitor 41 to constitute a CR-filter combined with the resistor 36 within the device 31. This configuration reduces high frequency noise and stabilizes the operation of the light-receiving device 31.

The semiconductor electronic device 51 is preferably an amplifier, such as a trans-impedance amplifier, which converts the current signal output from the light-receiving device into a voltage signal, and amplifies the voltage signal.

The electrical device 51 has a first 52, a second 53, a third 54, a fourth 55, a fifth 56, and a plurality of grounded electrodes 57 and 58. The electrical device 51 is placed between lead terminals 23 and 24 so as to face the second electrode 53 to the third electrode 35 of the light-receiving device 31.

The first electrode 52 is connected by a plural wire to the outermost pad 46 of the die capacitor 41 to supply the bias voltage Vcc to the electrical device 51. The second electrode 53 is connected to the third electrode 35 of the light-receiving device 31 by a bonding wire to input a current signal therefrom. The third electrode 54 and the fourth electrode 55 output signals to outside the module. The phases of two signals, which are output from the respective electrodes 54, 55 are complementary to each other. These electrodes 54, 55 are provided along respective edges facing to the lead terminals 23, 24. The fifth electrode 56 is wire-bonded to a pad of the second die capacitor 60, which operates as a filtering capacitor of the amplifier 151 integrated in the electrical device 51 and defines the cut-off frequency of the amplifier.

The grounded electrodes 57 are provided on both side of the second electrode 53 and connected to the pads 44, 45 of the die capacitor 41. Since the pads 44, 45 are connected to the base 11, the electrode 53 are also grounded.

Thus, in the first embodiment of the present invention, the electrode 57 are provided on both sides of the second electrode 53, into which the signal from the light-receiving device inputted, and grounded to the base 11 through the pads 44, 45 of the die capacitor 41. The total length of the bonding wire, namely a sum of the length from the electrode 57 to the pads of the die capacitor and that from the pads to the base 11, becomes shorter than the length when the electrode 57 is directly grounded to the base 11. This configuration enables to reduce a parasitic inductance due to the bonding wire, to prevent deformation of the bonding wire, and to reduce transmission impedance of the signal line from the light-receiving device to the electronic device, thus realizing a stable operation of the optical module for the transmission speed over 2.5 GHz.

Further in the present embodiment, the die capacitor 41 has the outermost pad 46 in addition to the previously mentioned pads 43 to 45. Because the outermost pad 46 is connected to the electrode 52 of the electronic device 51, a portion of die capacitor functioned between the pads 42, 46 as a coupling capacitor for the bias supply, which lowers the impedance of the bias supply.

The optical module of the present embodiment, the electronic device 51 has the third 54 and the fourth electrode 55 for outputting the amplified signals complementary to each other, and the electrodes 54, 55 are disposed along edges facing to the lead terminals 23, 24, respectively. This reduces the length of the bonding wire connecting these electrodes to the corresponding lead terminals, respectively, thus decreasing the parasitic inductance of the bonding wire and enhancing the high frequency performance of the module.

Figure 4:
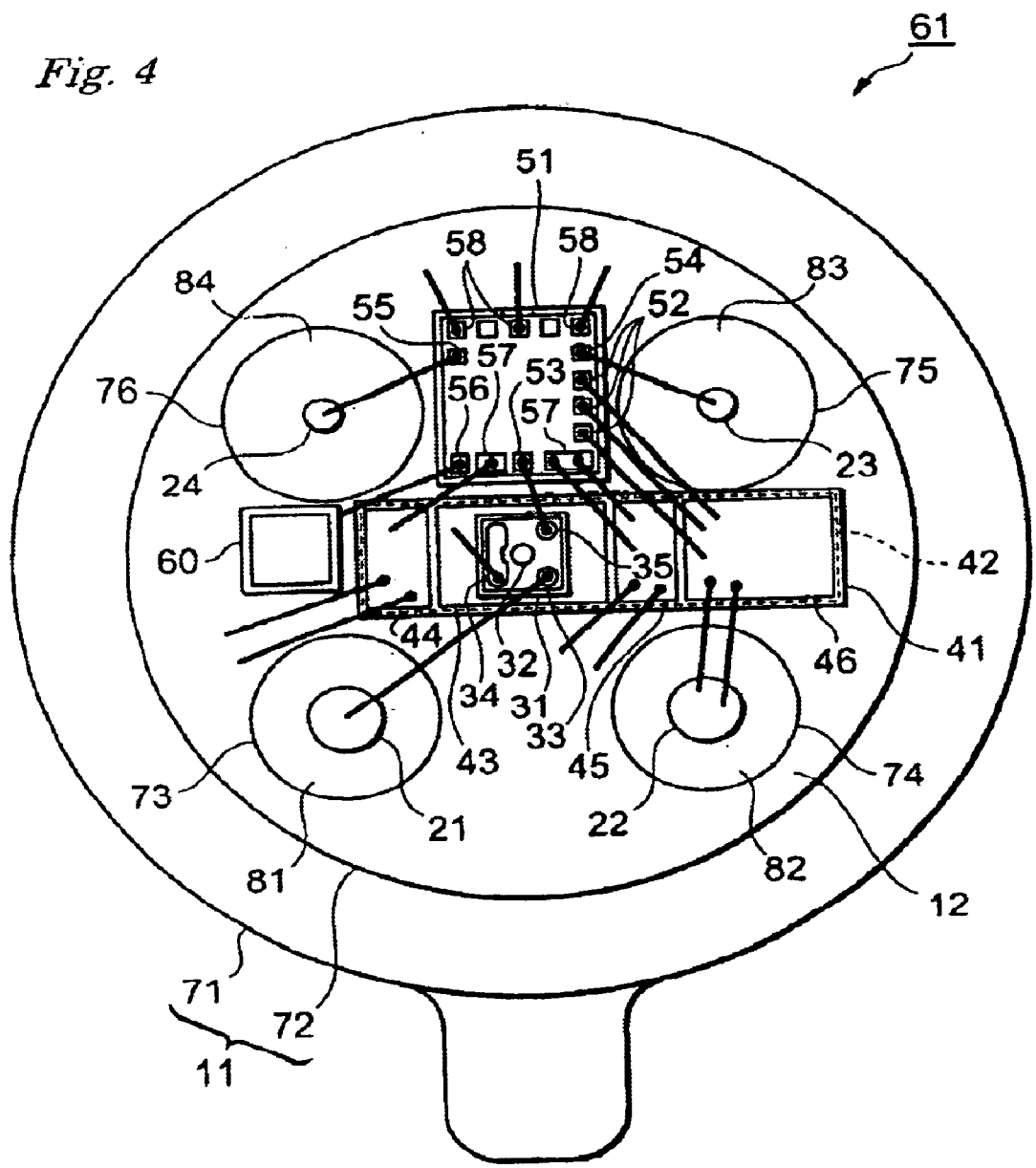
FIG. 4 is a cross sectional view of the second embodiment of the present invention.
Figure 5:
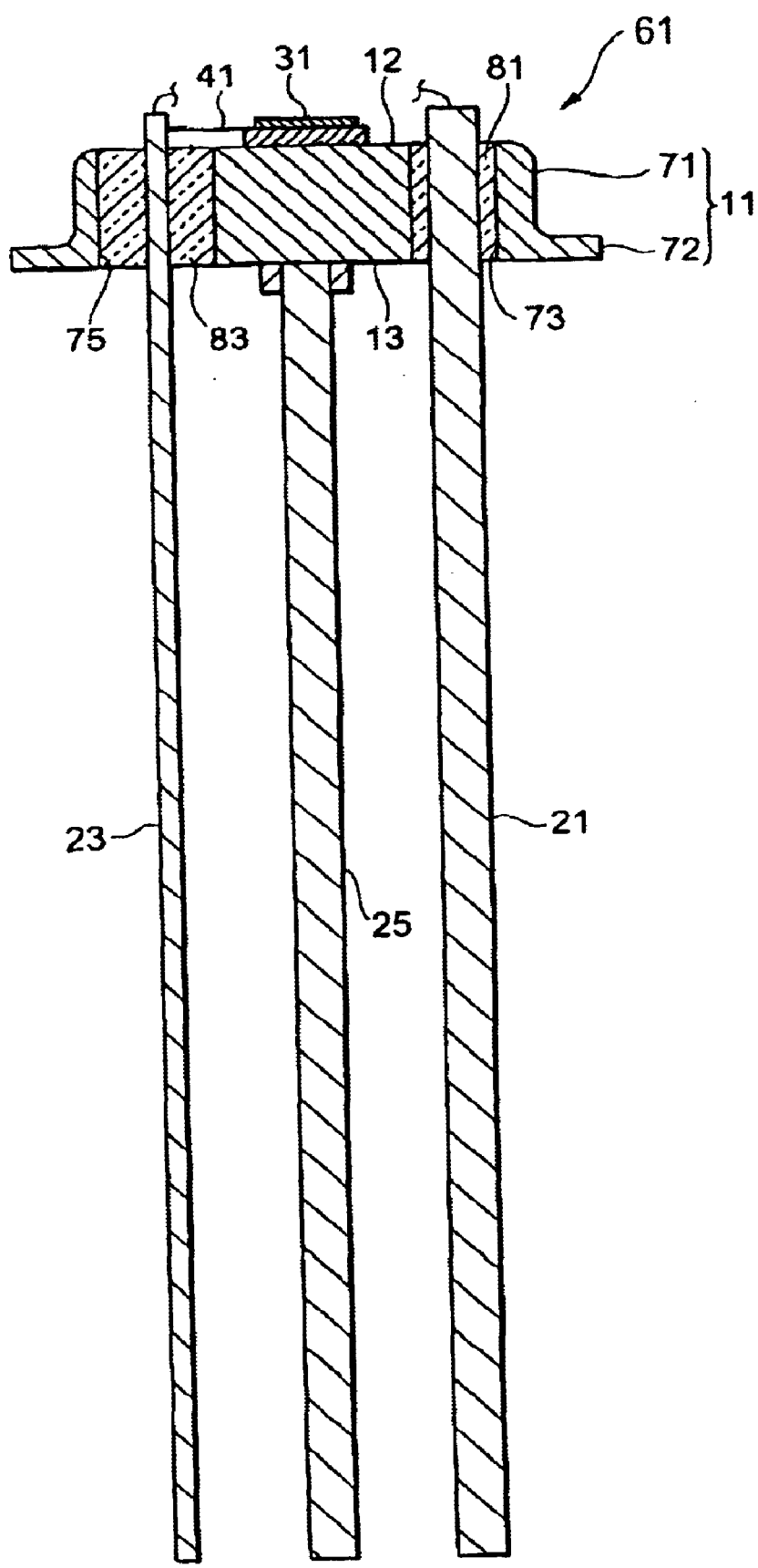
FIG. 5 is a plan view of the second embodiment of the module.

In addition, a plurality of bonding wires connects the first electrode to the outermost pad of the die capacitor, and another plurality of bonding wires also connects the lead terminal 22 to the pad 46. This decreases the equivalent inductance of the bonding wire, hence enhancing the high frequency performance of the module Second Embodiment Next, the second embodiment of the present invention will be described as referring FIG. 4 and FIG. 5. FIG. 4 shows a plan view, while FIG. 5 is a sectional view of the light-receiving module of the present invention. The second embodiment is different to the first embodiment in the viewpoint of the shape of the base 11.

The base 11 of the second embodiment has a body portion 71 including a mount surface 12 and an outer surface 13 opposing to the mount surface 12, and a brim portion 72 extending from the body portion 71. The base 11 is made of metal, such as Kovar or CuW, entire surface of which is plated with gold. The thickness and the diameter of the body portion 71 is preferably from 1.1 mm to 1.5 mm, and about 4.2 mm, respectively, while the diameter including the brim portion is about 5.4 mm.

The body portion 71 has a plurality of holes 73 to 76 connecting the mount surface 12 to the outer surface 13, into which the lead terminals 21 to 24 are inserted. The diameter of holes 73, 74 of the first group are about 0.8 mm, while those of the other holes 75, 76 are about 1.1 mm.

The lead terminals 21 to 24 are inserted into holes such that the tip of the lead terminal protrudes form the mount surface 12 by a length, typically 0.35 mm, and fixed to the body portion 71 such that the lead terminal is electrically isolated therefrom. The lead terminals 21 to 24 pass through nearly center of the holes 73 to 76. The outer diameter of the first group of the lead terminals 21, 22 are about 0.45 mm, while those of the second group of the lead terminals 23, 24 are 0.2 mm.

By filling a sealant material, such as glass sealant, into the gap between the lead terminals and the inner surface of the holes, the lead terminal 21 to 24 are fixed to the base 11. The dielectric constant of the glass sealant is about 4.1. This configuration realizes the impedance of the lead terminals 23, 24 at the holes 75, 76 to be about 50 ohm so as to transmit the signal with frequencies over 10 GHz.

The embodiment thus described realizes a configuration that the ground lines surrounds the signal line from the light-receiving device 31 to the electronic device 51, which lowers the transmission impedance of the signal line. The operation of the optical module is maintained to be stable at the transmission frequency over 2.5 GHz. Moreover in the second embodiment, since nearly whole portion of the base 11 is made of metal and the thickness of the base 11 is greater than that of the first embodiment, which decreases the thermal resistance and increases the thermal capacity, the heat dissipation can be enhanced.

Third Embodiment

Figure 6:
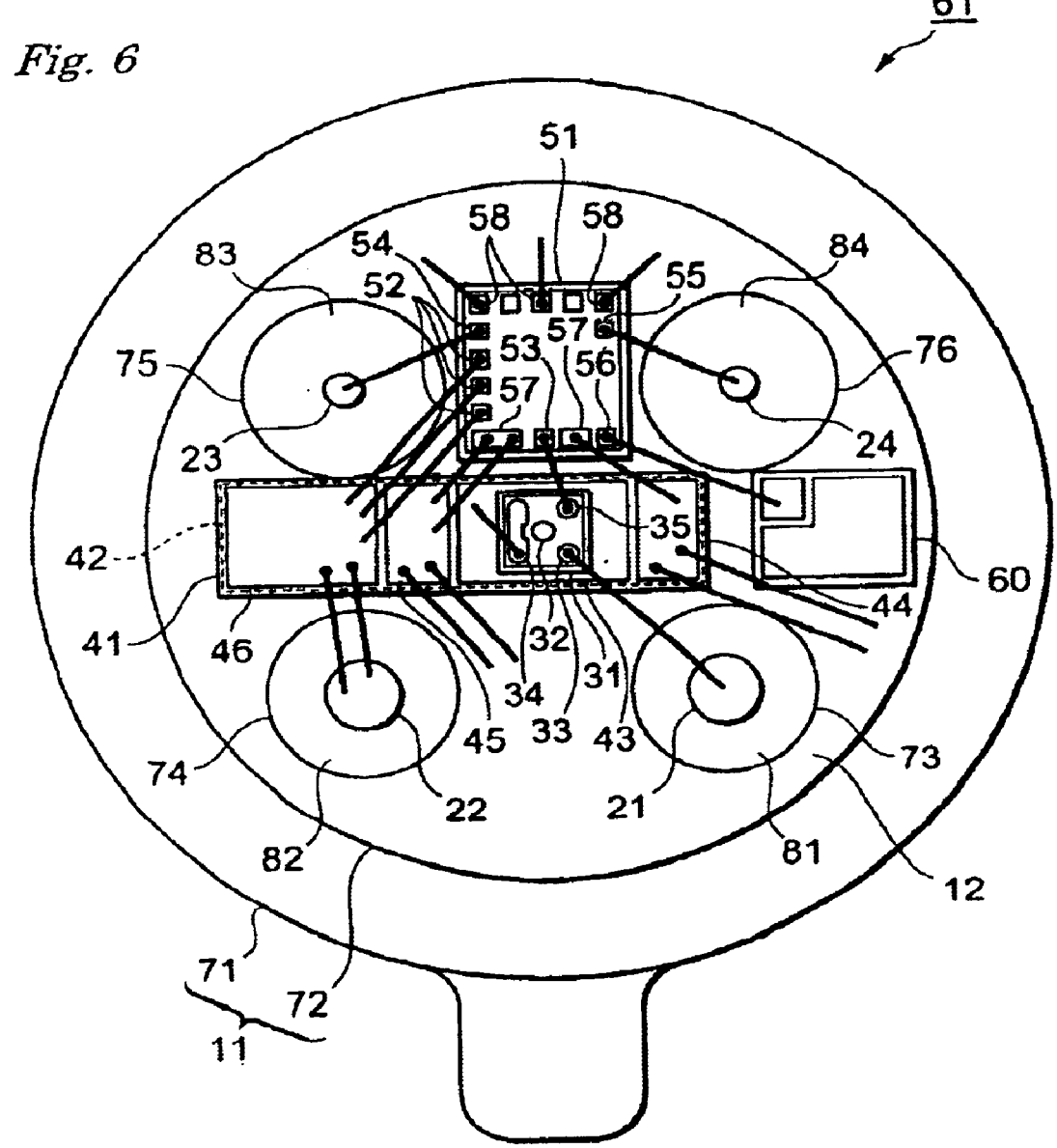
FIG. 6 is a plan view of the third embodiment of the module.
Figure 7:
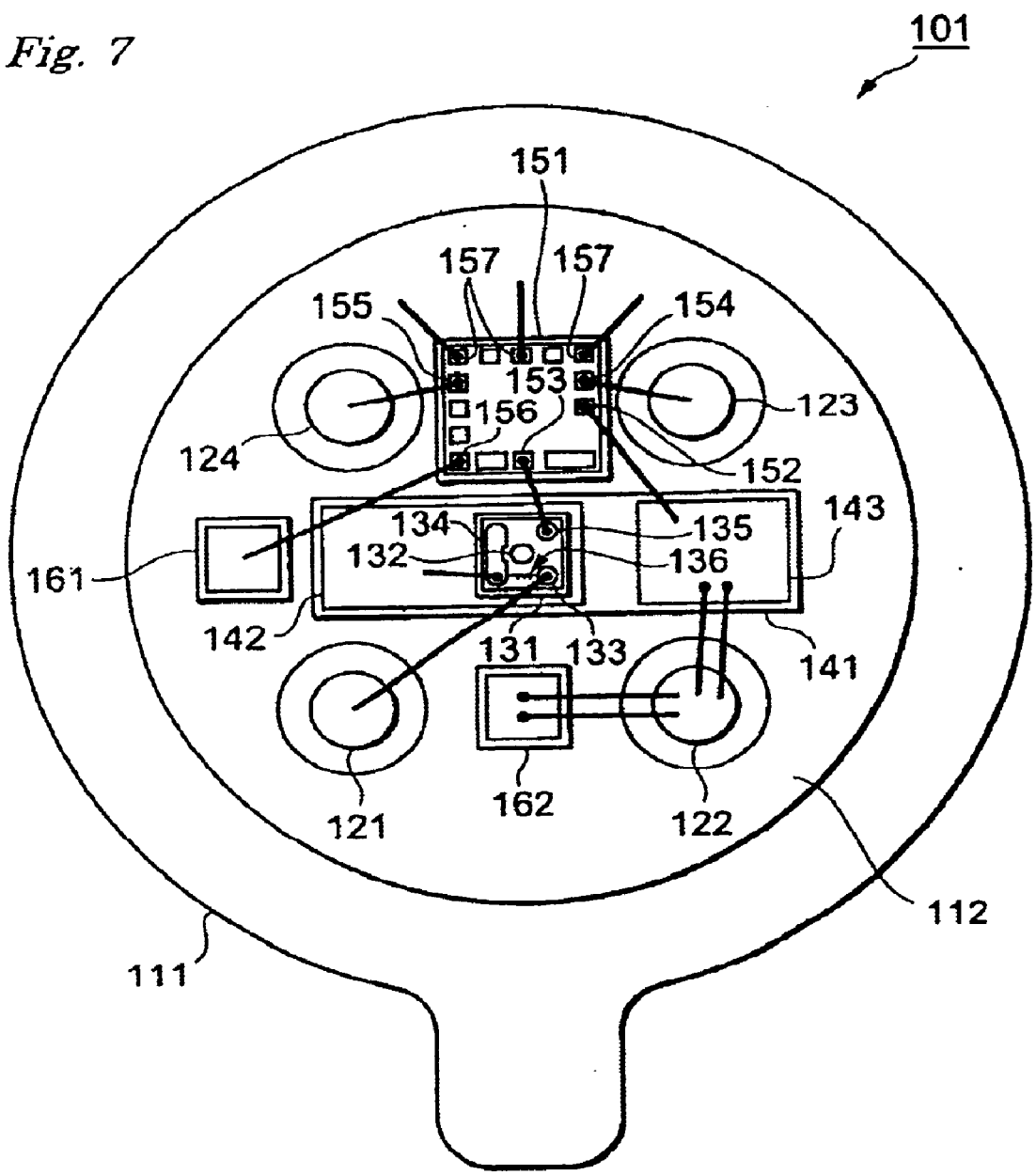
FIG. 7 is a plan view of the conventional optical module.

FIG. 6 is a plan view of the third embodiment of the optical module according to the present invention. In the third embodiment, the configuration of the second die capacitor 60 is different to the first and the second embodiments.

The second die capacitor 60 has a plurality of pads 91, 92 on the upper surface thereof. As explained previously since the die capacitor 60 defines the cut-off frequency of the filter integrated within the electronic device 51, the capacitance of the die capacitor must be determined precisely. As shown in FIG. 6, the pads of the capacitor 60 are divided into several portions, and the capacitance connected to the electrode 56 of the electronic device 51 is adjusted by selecting one of or the combination of a plural pad, thus changing the cut-off frequency of the filter in the electronic device 51.

From the invention thus described, it will be obvious that the invention and its application may be varied in many ways. For example, the first die capacitor 41 and the second die capacitor 60 may be integrated with each other, namely expanding the width of the first die capacitor, providing another pad in the expanding portion, and the second die capacitor is replaced by the additional die capacitor this another pad. Further, another die capacitor may be provided between the lead terminals 21 and 22. By connecting this another die capacitor between lead terminals to the lead terminal 21, the die capacitor functions as a coupling capacitance of the bias Vpd of the light-receiving device 31. Otherwise, by connecting this additional capacitor between the lead terminals to the lead terminal 22, the capacitor functions as a coupling capacitance of the bias Vcc for the electronic device.

Still further, the diameter of the bonding wires, which connects the electrodes of the light-receiving device 31 and the electronic device 41 and so on, is typically from 30 $\mu$m to 50 $\mu$m, it is preferably to use a metal ribbon, the width and the thickness of which is about 0.2 mm and 50 $\mu$m, respectively. This metal ribbon further improves the high frequency performance of the module because of reducing the parasitic inductance thereof. Such variations are not to be regarded as a departure from the spirit and scope of the invention, and all such modifications as would be obvious to one skilled in the art are intended for inclusion within the scope of the following claims.

What is claimed is:

1. An optical module for receiving an optical signal, converting the optical signal to an electrical signal and outputting the electrical signal, comprising:

a base having a mounting surface;

a die capacitor provided on the mounting surface and having a first pad and a pair of second pads, the first pad and the pair of second pads being disposed so that the pair of second pads sandwiches the first pad therebetween;

a semiconductor light-receiving device provided on said first pad of the die capacitor for receiving the optical signal and outputting a current signal corresponding to the optical signal; and a semiconductor electronic device having an inputting electrode for inputting the current signal from the light-receiving device and a pair of ground electrodes on both sides of the inputting electrode, the semiconductor electronic device being provided adjacent to the die capacitor so that the inputting electrode thereof opposes the outputting electrode of the semiconductor light-receiving device, wherein the ground electrodes of the electronic device are respectively connected to the second pads of the die capacitor and the second pads are respectively connected to the base.

2. The optical module according to clam 1, wherein the die capacitor further provides a third pad located outside of the second pad relatively to the first pad, and the semiconductor electronic device further provides a bias electrode connected to the third pad.

3. The optical module according to claim 1, further comprises a pair of lead terminals and the semiconductor electronic device further provides a pair of outputting electrodes for outputting the electrical signal, the respective outputting electrodes facing the respective lead terminals.

* * * * *